(12) United States Patent
Hsu (10) Patent No.: US 8,004,447 B2
(45) Date of Patent: Aug. 23, 2011

(54) SUCCESSIVE APPROXIMATION ANALOG TO DIGITAL CONVERTER AND METHOD THEREOF

(75) Inventor: Pochin Hsu, Hsinchu (TW)

(73) Assignee: Holtek Semiconductor, Hsinchu (TW)

( * ) Notice: Subject to any disclaimer, the term of this patent is extended or adjusted under 35 U.S.C. 154(b) by 0 days.

(21) Appl. No.: 12/693,713

(22) Filed: Jan. 26, 2010

(65) Prior Publication Data

US 2011/0084866 A1 Apr. 14, 2011

(30) Foreign Application Priority Data

Oct. 8, 2009 (TW) .............................. 98134196 A (51) Int. Cl.
*H03M 1/38* (2006.01)

(52) U.S. Cl. ....................................... 341/161; 341/155

(58) Field of Classification Search .................. 341/144, 341/155, 161, 172
See application file for complete search history.

(56) References Cited

U.S. PATENT DOCUMENTS

| | | | | |
|---|---|---|---|---|
| 5,581,252 A * | 12/1996 | Thomas | ......................... | 341/144 |
| 5,764,175 A * | 6/1998 | Pan | ................................. | 341/161 |
| 6,714,151 B2 * | 3/2004 | Tachibana et al. | ............ | 341/155 |
| 7,432,844 B2 * | 10/2008 | Mueck et al. | ................ | 341/163 |

* cited by examiner

*Primary Examiner* — Brian Young
(74) *Attorney, Agent, or Firm* — Volpe and Koenig, P.C.

(57) ABSTRACT

The configuration of a successive approximation analog to digital converter (ADC) and a method thereof are provided in the present invention. The proposed configuration includes a comparator having an inverting input terminal, a non-inverting input terminal and an output terminal outputting a comparison result, a most significant bit ADC coupled to the non-inverting input terminal, and a least significant bit ADC coupled to the inverting input terminal.

10 Claims, 8 Drawing Sheets

SUCCESSIVE APPROXIMATION ANALOG TO DIGITAL CONVERTER AND METHOD THEREOF

FIELD OF THE INVENTION

The present invention relates to a successive approximation analog to digital converter (SAR ADC). More particularly, it relates to an SAR ADC having a comparator and a most significant bit (MSB) and a least significant bit (LSB) capacitor arrays respectively coupled to positive and negative terminals of the comparator, and applies to high resolution occasions.

BACKGROUND OF THE INVENTION

Figure 1:
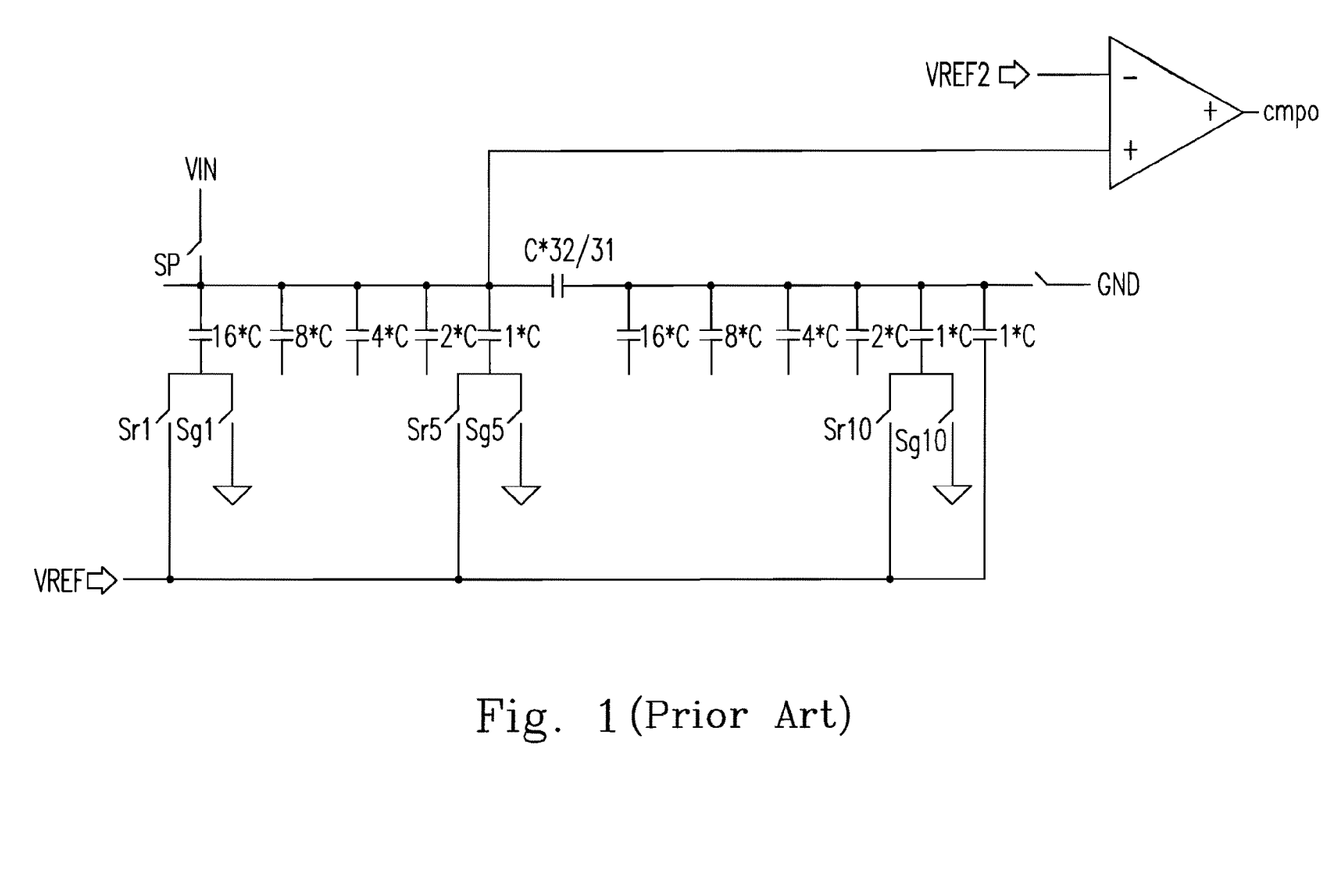
FIG. 1 shows a schematic circuit diagram of a conventional SAR ADC in the prior art.

FIG. 1 shows a schematic circuit diagram of a conventional SAR ADC in the prior art. In FIG. 1, C*32/31 and all of the capacitors on its right-hand side form the LSB capacitor array, all of the capacitors on its left-hand side form the MSB capacitor array, this is a 10 bits SAR ADC, MSB capacitor array has 5 bits and LSB capacitor array also has 5 bits. VIN is an analog input signal, VREF and VREF/2 are reference voltages, cmpo is an output terminal of a comparator, and GND is a ground.

Although the capacitor area shrinks due to the series-connected C*32/31 makes proportions of the maximum capacitance over the minimum capacitance of the two respective capacitor arrays on both sides of C*32/31 decrease, there are conversion errors of capacitance liable to generate by manufacturing procedures or by drawing problems since the capacitance of the series-connected C*32/31 is not an integer.

The drawbacks of the conventional circuit in FIG. 1 are further elaborated as follows:

a) C*32/31 with non-integer capacitance is required to connect the two MSB and LSB capacitor arrays, the real drawing of C*32/31 is not easy to be accurate, and the capacitance of C*32/31 is also not easy to be adjusted if there is an error;

b) all of the capacitors are required to take part in the distribution of the charges each time there is a conversion procedure or a sampling, and thus the time to reach a stability among terminal potentials is prolonged.

Base on the aforementioned drawbacks of the conventional SAR ADC, a more effective capacitor arrangement to solve the problem of the capacitance of the series-connected capacitor not being an integer in the conventional capacitor arrangement is required such that the matching problem of the capacitance could be eased.

Keeping the drawbacks of the prior arts in mind, and employing experiments and research full-heartily and persistently, the applicant finally conceived an SAR ADC and a method thereof.

SUMMARY OF THE INVENTION

It is therefore an object of the present invention to provide an SAR ADC having a comparator and an MSB and an LSB capacitor arrays coupled to one of the non-inverting and inverting terminals and the other one of the inverting and non-inverting terminals of the comparator respectively such that the problem of the capacitance of the series-connected capacitor not being an integer in the conventional capacitor arrangement is solved via employing a more effective capacitor arrangement and the matching problem of the capacitance could be eased.

According to the first aspect of the present invention, a successive approximation analog to digital converter comprises a comparator having an inverting input terminal, a non-inverting input terminal and an output terminal outputting a comparison result, an MSB capacitor array having a first input terminal receiving a first reference voltage, a second input terminal sampling a signal so as to proceed a first conversion, a third input terminal receiving a second reference voltage, and a second output terminal outputting a first potential value and coupled to one of the inverting input terminal and the non-inverting input terminal, and an LSB capacitor array having a fourth input terminal receiving the second reference voltage, a third output terminal outputting a second potential value, coupled to the non-inverting input terminal when the second input terminal is coupled to the inverting input terminal, and coupled to the inverting input terminal when the second input terminal is coupled to the non-inverting input terminal.

Preferably, the MSB capacitor array has an MSB, the LSB capacitor array has a LSB, the signal is an analog signal, the first conversion begins from the MSB, the second potential voltage is kept at the second reference voltage when the MSB capacitor array proceeds the first conversion, the first potential value is kept unchanged and the LSB capacitor proceeds a second conversion until the LSB is reached when the first conversion is accomplished, and the first and the second conversions proceed according to the comparison result so as to output a digital signal.

Preferably, the converter further comprises a successive approximation switch controller, the LSB capacitor array comprises m bits, the MSB capacitor array comprises (n-m) bits, each the bit corresponds to at least one capacitor and at least one switch, the successive approximation switch controller is coupled to the first output terminal of the comparator, the at least one switch of each of the (n-m) bits of the MSB capacitor array is switched to adjust a potential of each the bit according to the comparison result so as to change the first potential value when the first conversion proceeds, and the at least one switch of each of the m bits of the LSB capacitor array is switched to adjust the potential of each the bit according to the comparison result so as to change the second potential value when the second conversion proceeds.

Preferably, the LSB capacitor array further comprises a fifth input terminal receiving a third reference voltage, and the third reference voltage has a value being (the first reference voltage)/$(2)^m$.

Preferably, the LSB capacitor array further comprises a fifth and a sixth input terminals respectively receiving a third and a fourth reference voltages, and a difference of the third and the fourth reference voltages has a value being (the first reference voltage)/$(2)^m$.

Preferably, the successive approximation switch controller comprises a MSB controller coupled to the first output terminal of the comparator and the MSB capacitor array and controlling the MSB capacitor array according to the comparison result, and a LSB controller coupled to the first output terminal of the comparator and the LSB capacitor array and controlling the LSB capacitor array according to the comparison result.

Preferably, the second reference voltage has a value being one half of the first reference voltage.

According to the second aspect of the present invention, an SAR ADC comprises a comparator having an inverting input terminal, a non-inverting input terminal and an output terminal outputting a comparison result, an MSB array coupled to one of the inverting and the non-inverting input terminals, and an LSB array coupled to the other one of the inverting and non-inverting input terminals.

Preferably, the MSB array is an MSB analog to digital converter (ADC) and the LSB array is an LSB ADC.

Preferably, the MSBADC is an MSB capacitor array and the LSBADC is a resistor array.

Preferably, the MSBADC is a resistor array and the LSBADC is an LSB capacitor array.

According to the third aspect of the present invention, a controlling method for an SAR ADC, comprising the steps of: (a) providing a sample of a signal, an MSB array having (n-m) bits, an LSB array having m bits and a comparator coupled to the MSB array and the LSB array and outputting a comparison result; (b) adjusting a terminal potential value of each of the (n-m) bits of the MSB array according to the comparison result and keeping a terminal potential value of each of the m bits of the LSB array unchanged; (c) adjusting a terminal potential value of each of the m bits of the LSB array after an adjustment of each the terminal potential of the MSB array is accomplished and keeping the terminal potential value of each of the (n-m) bits of the MSB array unchanged; and (d) outputting a digital signal after the adjustment of each the terminal potential of each of the m bits of the LSB array is accomplished.

Preferably, the MSB array has an MSB, the LSB array has an LSB, the adjustment begins from the MSB toward the LSB, the signal is an analog signal, the MSB array is an MSB capacitor array, the LSB array is an LSB capacitor array, and the step (b) further comprises the steps of: (b1) providing at least one capacitor and at least one switch corresponding to each of the (n-m) bits of the MSB capacitor array and receiving a first reference voltage value via the MSB capacitor array; (b2) maintaining a terminal potential value of each of the m bits of the LSB capacitor array at one half of the first reference voltage value when the terminal potential value of each of the (n-m) bits of the MSB capacitor array is adjusted; and (b3) switching the at least one switch of each of the (n-m) bits of the MSB capacitor array to adjust the terminal potential value of each of the (n-m) bits of the MSB capacitor array.

Preferably, the step (c) further comprises steps of: (c1) providing at least one capacitor and at least one switch corresponding to each the bit of the LSB capacitor array and receiving a second and a third reference voltage values via the LSB capacitor array, wherein the second reference voltage value is one half of the first reference voltage value and the third reference voltage value is the first reference voltage value multiplying $1/(2)^m$; (c2) maintaining the terminal potential value of each of the (n-m) bits of the MSB capacitor array unchanged when the terminal potential value of each of the m bits of the LSB capacitor array is adjusted; and (c3) switching the at least one switch of each of the m bits of the LSB capacitor array to adjust the terminal potential value of each of the m bits of the LSB capacitor array.

The present invention may best be understood through the following descriptions with reference to the accompanying drawings, in which:

DETAILED DESCRIPTION OF THE PREFERRED EMBODIMENT

Figure 2:
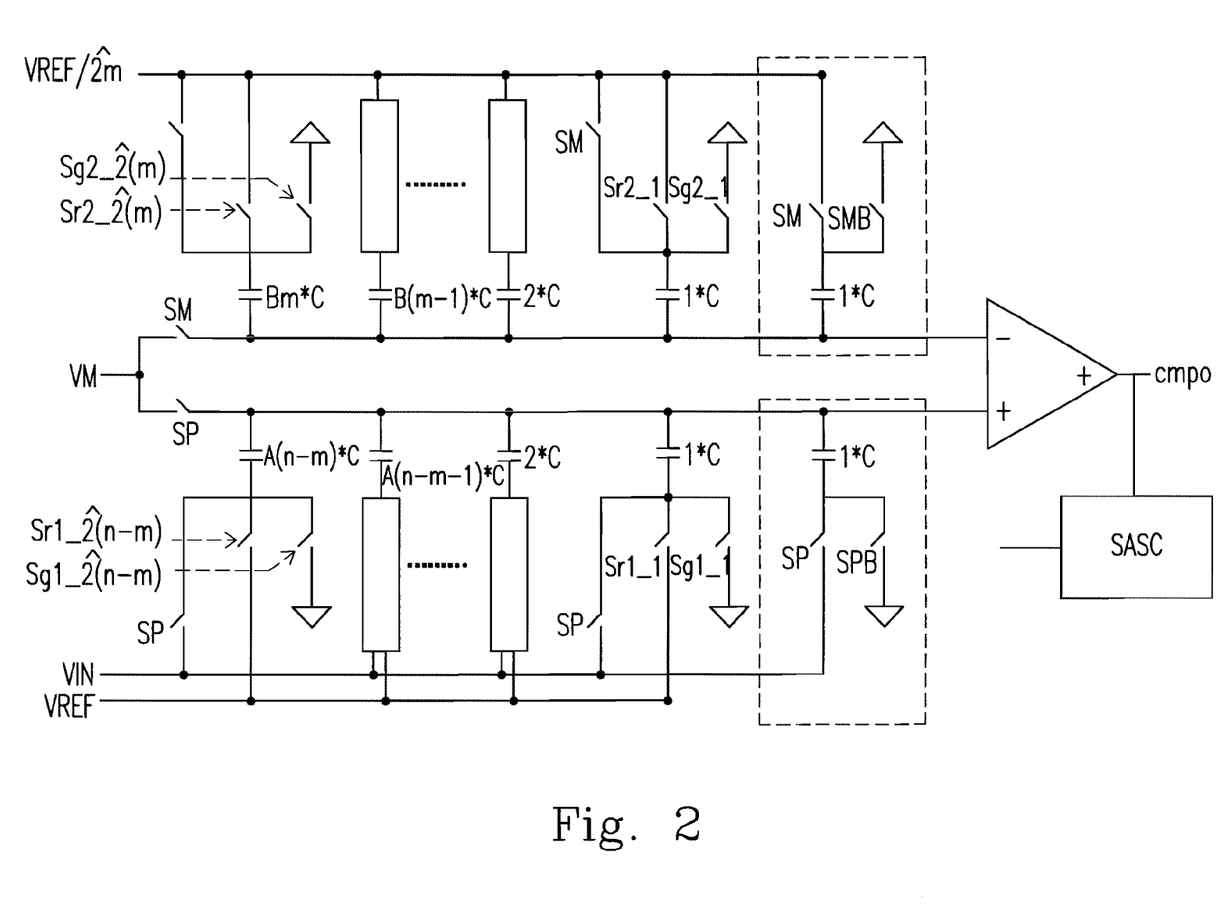
FIG. 2 shows a schematic circuit diagram of an SAR ADC according to the first preferred embodiment of the present invention.

Please refer to FIG. 2, it shows a schematic circuit diagram of an SAR ADC according to the first preferred embodiment of the present invention. In FIG. 2, the upper half is an LSB capacitor array, the lower half is an MSB capacitor array and the SASC is a successive approximation switch controller.

As shown in FIG. 2, the capacitors of the present invention are distributed to be coupled to the two terminals of the comparator. The non-inverting terminal of the comparator could be coupled to the MSB capacitor array, and the inverting terminal of the comparator could be coupled to the LSB capacitor array (naturally, in other preferred embodiments of the present invention (not shown), the inverting terminal of the comparator could be coupled to the MSB capacitor array, and the non-inverting terminal of the comparator could be coupled to the LSB capacitor array). When the comparator compares and finds the potential difference between its two terminals, the terminal potentials on the terminals of capacitors could be determined. Due to the change of the terminal potentials, the redistributed charges generate new potentials on the two terminals of the comparator, and then a next run of comparison begins. The comparison begins from the MSB and continues until the LSB is determined, and then the first conversion is accomplished.

In FIG. 2, the terminals of LSB capacitor array are kept at the VM potential when the MSB capacitor array are under the conversion, and the potentials of the terminals of the LSB capacitor array are allowed to change only after all of the capacitors of the MSB are processed. At this time, all of the terminals of the MSB have generated the final potentials according to the comparison result of the last time and kept unchanged for the following time period. Thus, the inverting terminal of the comparator is continuously approximated to the non-inverting terminal when the LSB capacitor array is processed.

As shown in FIG. 2, only the MSB capacitor array would sample VIN when the conversion begins. At the mean time, both of the two terminals of the comparator are set to VM, and VM could be chosen as VREF/2 in general. The potential of VREF/2^m could be ready late until just before the end of the conversion of the MSB.

The provided new structure of the present invention is suitable to process SAR ADC having multiple bits, and has the advantages of:

1. The proportional capacitor located in the middle of and connected between the MSB capacitor array and the LSB capacitor array in series is no longer required. In the prior art, a capacitor connects the two capacitor arrays in series, the capacitance of this capacitor is not an integer as above-mentioned, and a gain error is liable to generate during the conversion procedure due to the errors caused by the drawing and by the manufacturing process.

2. The conversions of the MSB and the LSB capacitor arrays are respectively processed on the two separated terminals of the comparator. Thus, the charges on the capacitors can be rapidly generated and redistributed after the comparison result is generated by the comparator.

3. Only the capacitors in the MSB capacitor array engage in charging and discharging procedures during the sampling procedure.

4. Errors of conversions are only related to the capacitor matching of the respective MSB and LSB capacitor arrays, and the respective unit capacitors of the two capacitor arrays are not required to be the same.

5. It is easier to generate the voltage division of VREF, and is easier to process the calibration of the electrical circuit.

The proposed structure could be a symmetric structure. For example, a 10 bit SAR ADC could be divided into a 5-bit MSB and a 5-bit LSB capacitor arrays.

Figure 3:
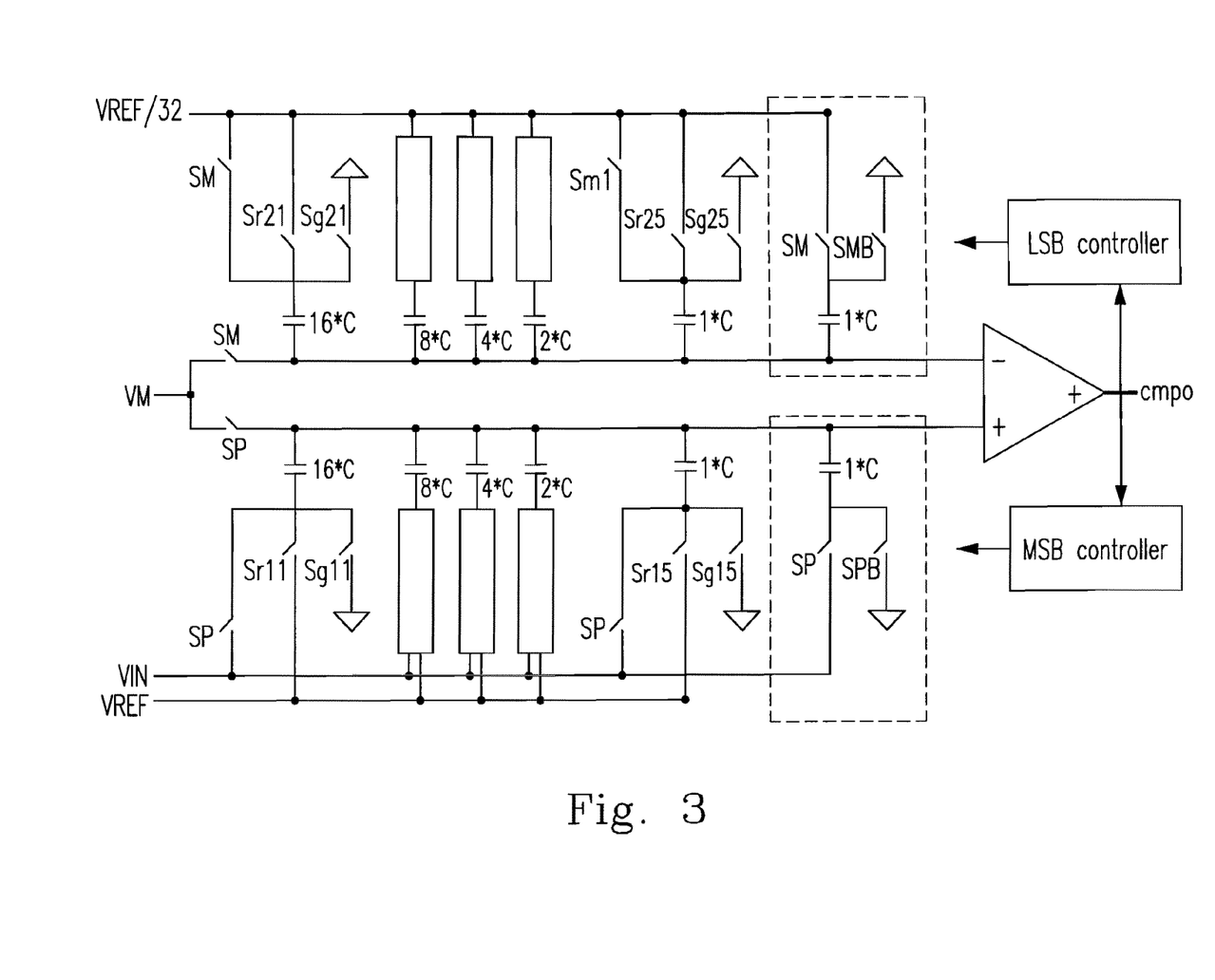
FIG. 3 shows a schematic circuit diagram of a 10 bit SAR ADC according to the first preferred embodiment of the present invention.

Using the 10 bit SAR ADC as an example as follows. The 10 bit SAR ADC is divided into a 5-bit MSB and a 5-bit LSB capacitor arrays, and a simulation of which is accomplished by a real circuit. FIG. 3 shows a schematic circuit diagram of a 10 bit SAR ADC according to the first preferred embodiment of the present invention.

Figure 4:
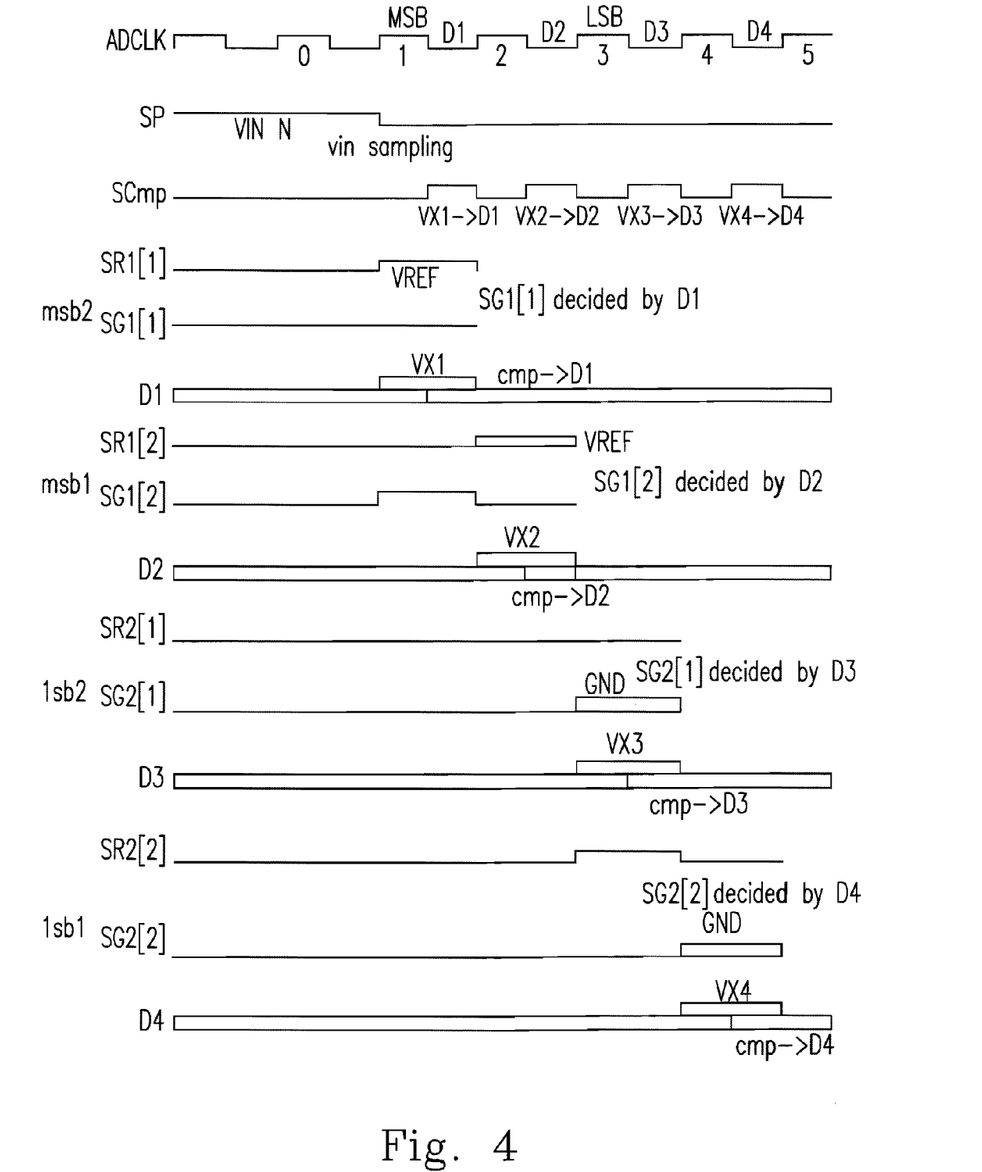
FIG. 4 shows a time series diagram of a 4 bit SAR ADC according to the first preferred embodiment of the present invention.

FIG. 4 shows a time series diagram of a 4 bit SAR ADC according to the first preferred embodiment of the present invention (divided into a 2-bit MSB capacitor array and a 2-bit LSB capacitor array). In FIG. 4, D1-D4 are comparison results in four time periods, the turn-on and turn-off of switches are decided by D1-D4 such that the potentials of MSB and LSB capacitor array are changed accordingly. When D1=0, SR1[1]=0 and SG1[1]=1; when D1=1, SR1[1]=1 and SG1[1]=0; when D2=0, SR1[2]=0 and SG1[2]=1; when D2=1, SR1[2]=1 and SG1[2]=0; when D3=0, SR2[1]=1 and SG2[1]=0; when D3=1, SR2[1]=0 and SG2[1]=1; when D4=0, SR2[2]=1 and SG2[2]=0; and when D4=1, SR2[2]=0 and SG2[2]=1. Similarly, it could be derived to a time series diagram of a 10 bit SAR ADC according to the first preferred embodiment of the present invention (divided into a 5-bit MSB capacitor array and a 5-bit LSB capacitor array). That is to say, when D1=0, SR1[1]=0 and SG1[1]=1; when D1=1, SR1[1]=1 and SG1[1]=0; when D2=0, SR1[2]=0 and SG1[2]=1; when D2=1, SR1[2]=1 and SG1[2]=0; when D3=0, SR1[3]=0 and SG1[3]=1; when D3=1, SR1[3]=1 and SG1[3]=0; when D4=0, SR1[4]=0 and SG1[4]=1; when D4=1, SR1[4]=1 and SG1[4]=0; when D5=0, SR1[5]=0 and G1[5]=1; when D5=1, SR1[5]=1 and SG1[5]=0; when D6=0, SR2[1]=1 and SG2[1]=0; when D6=1, SR2[1]=0 and SG2[1]=1; when D7=0, SR2[2]=1 and SG2[2]=0; when D7=1, SR2[2]=0 and SG2[2]=1; when D8=0, SR2[31]=1 and SG2[3]=0; when D8=1, SR2[3]=0 and SG2[3]=1; when D9=0, SR2[4]=1 and SG2[4]=0; when D9=1, SR2[4]=0 and SG2[4]=1; when D10=0, SR2[5]=1 and SG2[5]=0; and when D10=1, SR2[5]=0 and SG2[5]=1.

Figure 5:
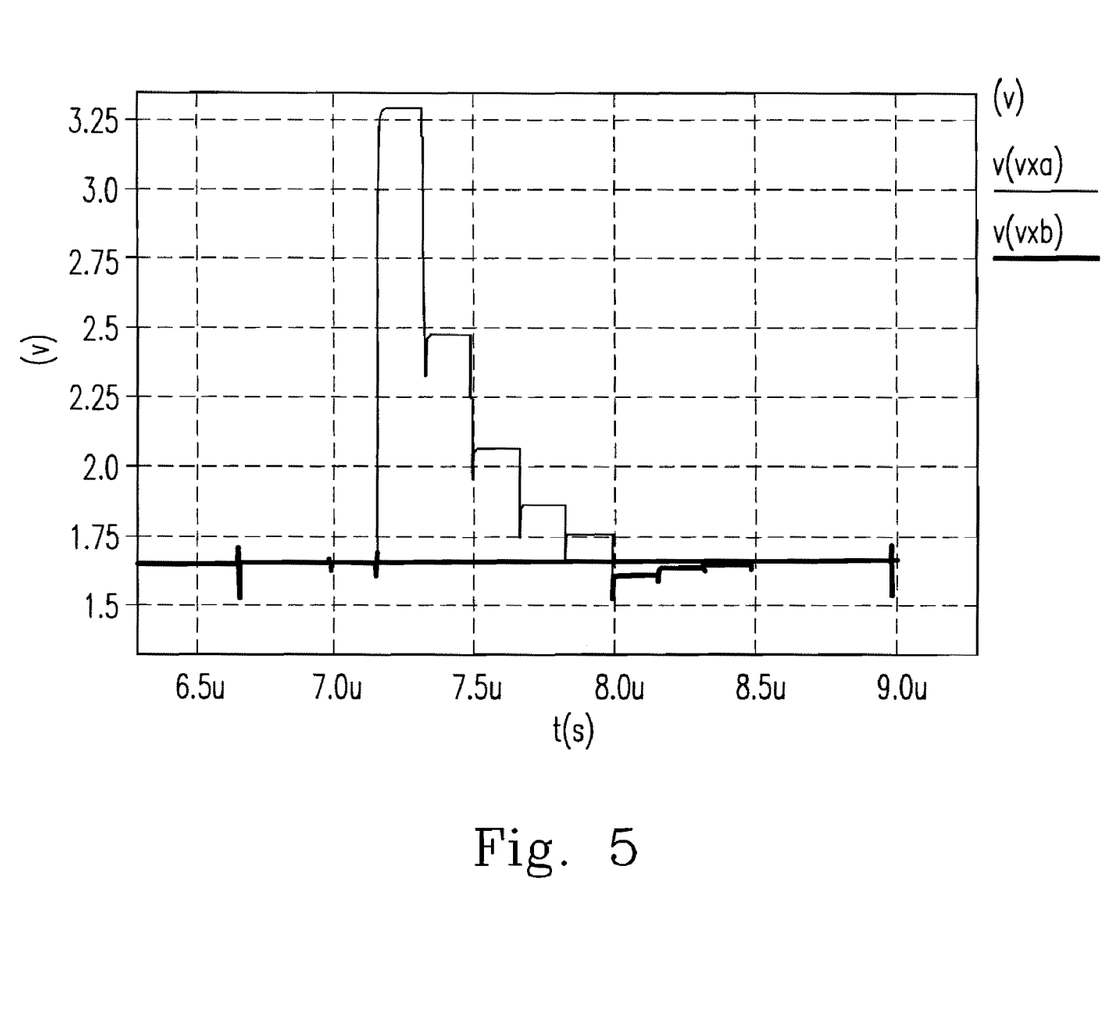
FIG. 5 shows a simulated waveform diagram of the 5-bit MSB capacitor array of a 10 bit SAR ADC according to the first preferred embodiment of the present invention.

FIG. 5 shows a simulated waveform diagram of the 5-bit MSB capacitor array of a 10 bit SAR ADC according to the first preferred embodiment of the present invention, in which, vxa is the non-inverting terminal (v(vxa) in thin solid line), and vxb is the inverting terminal (v(vxb) in thick solid line). Observing from FIG. 5 for the procedure of comparison, v(vxb) keeps unchanged when v(vxa) begins to change. The potentials of the MSB capacitor array are maintained unchanged after the comparison is accomplished, and then v(vxb) begins to approximate v(vxa) again such that all of the comparisons could be accomplished. In FIG. 5, the input potential is 0, VREF=3.3, and conversion=00000,00000/b.

Figure 6:
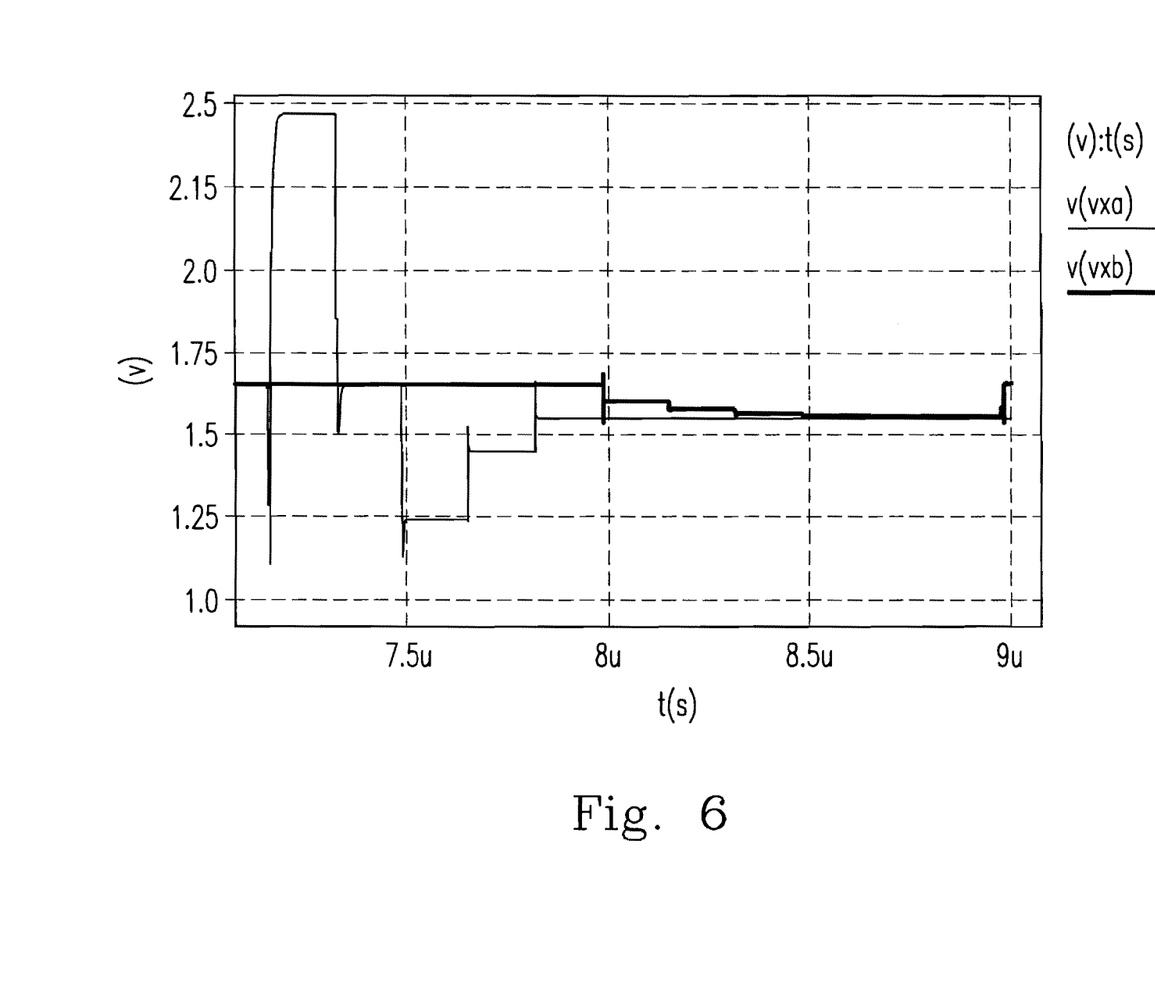
FIG. 6 shows a simulated waveform diagram of the 5-bit LSB capacitor array of a 10 bit SAR ADC according to the first preferred embodiment of the present invention.

FIG. 6 shows a simulated waveform diagram of the 5-bit LSB capacitor array of a 10 bit SAR ADC according to the first preferred embodiment of the present invention. In FIG. 6, the input potential is 3.3/4=0.825, VREF=3.3, and conversion=00111,11111/b=255/d.

Figure 7:
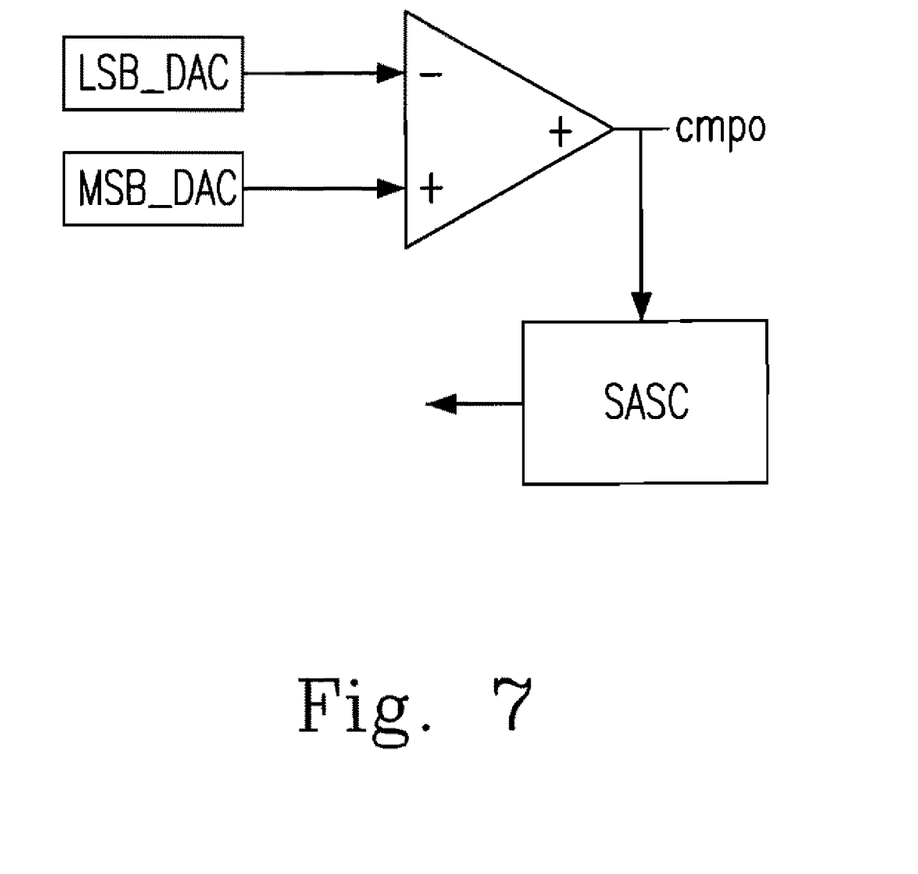
FIG. 7 shows a block diagram of an SAR ADC according to the first preferred embodiment of the present invention.

FIG. 7 shows a block diagram of an SAR ADC according to the first preferred embodiment of the present invention, it shows an LSB_ADC (analog to digital converter) and an MSB_ADC respectively connected to the inverting terminal and the non-inverting terminal of the comparator. Besides, it is allowable not to employ two capacitive modes at the same time to generate both of the input terminal potentials of the comparator, and that is to say, one of LSB_ADC and MSB_ADC could be a resistor array. For example, LSB_ADC is a resistor array, and MSB_ADC is a MSB capacitor array. Or, MSB_ADC is a resistor array, and LSB_ADC is a LSB capacitor array. This is a mode of not using two capacitor ADCs simultaneously to generate the two input terminal potentials of the comparator.

Figure 8:
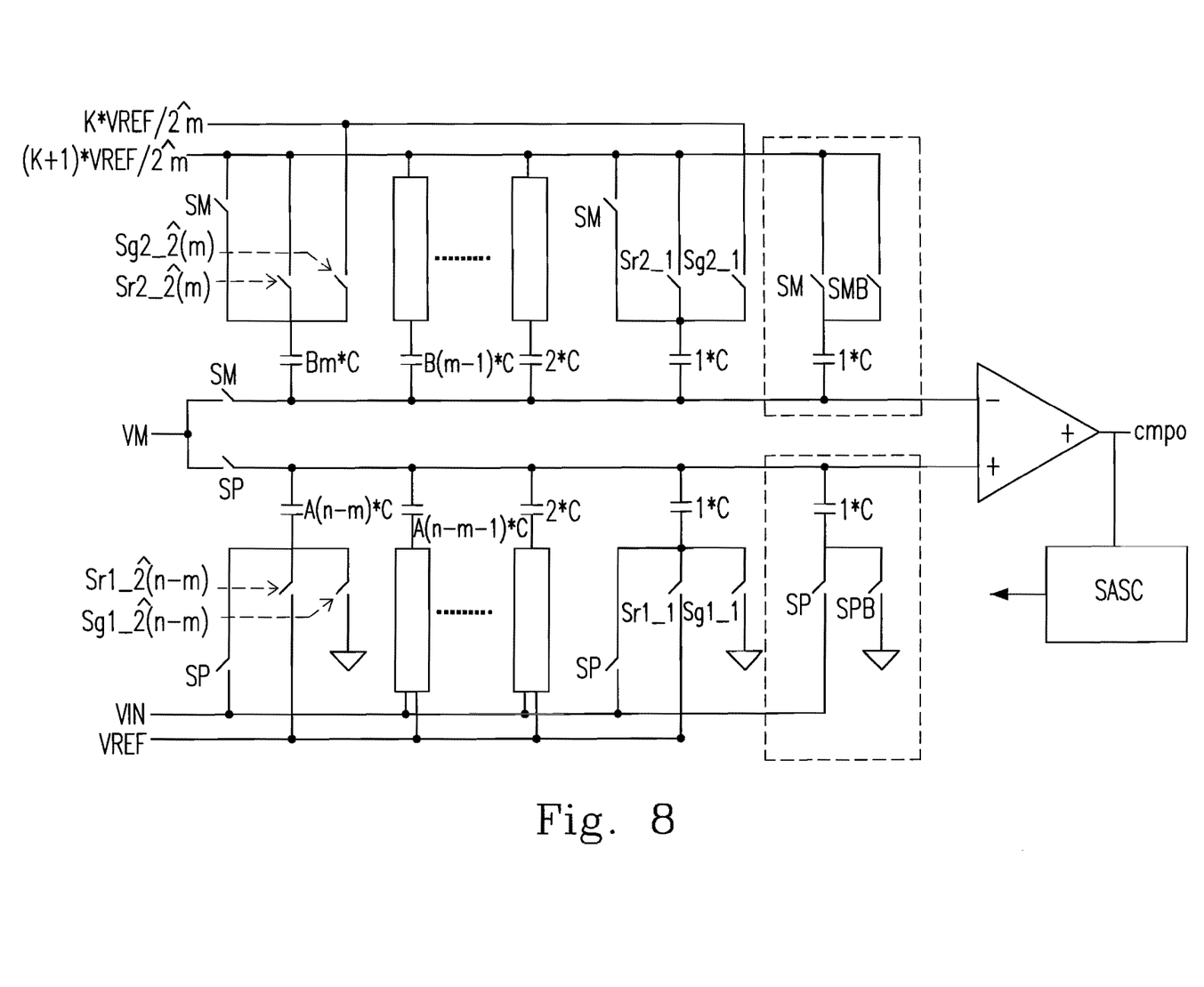
FIG. 8 shows a schematic circuit diagram of an SAR ADC according to the second preferred embodiment of the present invention.

Furthermore, one of the reference voltages of the LSB capacitor array is not necessarily to be a ground as long as a voltage difference of $VREF/2^m$ is generated in the present invention. For example, FIG. 8 shows a schematic circuit diagram of an SAR ADC according to the second preferred embodiment of the present invention.

According to the aforementioned descriptions, the present invention provides an SAR ADC having a comparator and an MSB and an LSB capacitor arrays coupled to one of the non-inverting and inverting terminals and the other one of the inverting and non-inverting terminals of the comparator respectively such that the problem of the capacitance of the series-connected capacitor not being an integer in the conventional capacitor arrangement is solved via employing a more effective capacitor arrangement and the matching problem of the capacitance could be eased so as to possess the non-obviousness and the novelty.

While the invention has been described in terms of what are presently considered to be the most practical and preferred embodiments, it is to be understood that the invention need not be limited to the disclosed embodiment. On the contrary, it is intended to cover various modifications and similar arrangements included within the spirit and scope of the appended claims, which are to be accorded with the broadest interpretation so as to encompass all such modifications and similar structures. Therefore, the above description and illustration should not be taken as limiting the scope of the present invention which is defined by the appended claims.

What is claimed is:

1. A successive approximation analog to digital converter, comprising:
   a comparator having an inverting input terminal, a non-inverting input terminal and an output terminal outputting a comparison result;
   a most significant bit (MSB) capacitor array having a first input terminal receiving a first reference voltage, a second input terminal sampling a signal so as to proceed a first conversion, a third input terminal receiving a second reference voltage, and a second output terminal outputting a first potential value and coupled to one of the inverting input terminal and the non-inverting input terminal; and
   a least significant bit (LSB) capacitor array having a fourth input terminal receiving the second reference voltage, a third output terminal outputting a second potential value, coupled to the non-inverting input terminal when the second input terminal is coupled to the inverting input terminal, and coupled to the inverting input terminal when the second input terminal is coupled to the non-inverting input terminal.

2. A converter according to claim 1, wherein the MSB capacitor array has an MSB, the LSB capacitor array has an LSB, the signal is an analog signal, the first conversion begins from the MSB, the second potential voltage is kept at the second reference voltage when the MSB capacitor array proceeds the first conversion, the first potential value is kept unchanged and the LSB capacitor proceeds a second conversion until the LSB is reached when the first conversion is accomplished, and the first and the second conversions proceed according to the comparison result so as to output a digital signal.

3. A converter according to claim 1 further comprising a successive approximation switch controller, wherein the LSB capacitor array comprises m bits, the MSB capacitor array comprises (n-m) bits, each bit corresponds to at least one capacitor and at least one switch, the successive approximation switch controller is coupled to the first output terminal of the comparator, the at least one switch of each of the (n-m) bits of the MSB capacitor array is switched to adjust a potential of each bit according to the comparison result so as to change the first potential value when the first conversion proceeds, and the at least one switch of each of the m bits of the LSB capacitor array is switched to adjust the potential of each bit according to the comparison result so as to change the second potential value when the second conversion proceeds.

4. A converter according to claim 3, wherein the LSB capacitor array further comprises a fifth input terminal receiving a third reference voltage, and the third reference voltage has a value being (the first reference voltage)/$(2)^m$.

5. A converter according to claim 3, wherein the LSB capacitor array further comprises a fifth and a sixth input terminals respectively receiving a third and a fourth reference voltages, and a difference of the third and the fourth reference voltages has a value being (the first reference voltage)/$(2)^m$.

6. A converter according to claim 3, wherein the successive approximation switch controller comprises a MSB controller coupled to the first output terminal of the comparator and the MSB capacitor array and controlling the MSB capacitor array according to the comparison result, and a LSB controller coupled to the first output terminal of the comparator and the LSB capacitor array and controlling the LSB capacitor array according to the comparison result.

7. A converter according to claim 1, wherein the second reference voltage has a value being one half of the first reference voltage.

8. A controlling method for a successive approximation analog to digital converter, comprising the steps of:

(a) providing a sample of a signal, a most significant bit (MSB) array having (n-m) bits, a least significant bit (LSB) array having m bits and a comparator coupled to the MSB array and the LSB array and outputting a comparison result;

(b) adjusting a terminal potential value of each of the (n-m) bits of the MSB array according to the comparison result and keeping a terminal potential value of each of the m bits of the LSB array unchanged;

(c) adjusting a terminal potential value of each of the m bits of the LSB array after an adjustment of each terminal potential of the MSB array is accomplished and keeping the terminal potential value of each of the (n-m) bits of the MSB array unchanged; and (d) outputting a digital signal after the adjustment of each terminal potential of each of the m bits of the LSB array is accomplished.

9. A method according to claim 8, wherein the MSB array has an MSB, the LSB array has an LSB, the adjustment begins from the MSB toward the LSB, the signal is an analog signal, the MSB array is an MSB capacitor array, the LSB array is an LSB capacitor array, and the step (b) further comprises the steps of:

(b1) providing at least one capacitor and at least one switch corresponding to each of the (n-m) bits of the MSB capacitor array and receiving a first reference voltage value via the MSB capacitor array;

(b2) maintaining a terminal potential value of each of the m bits of the LSB capacitor array at one half of the first reference voltage value when the terminal potential value of each of the (n-m) bits of the MSB capacitor array is adjusted; and (b3) switching the at least one switch of each of the (n-m) bits of the MSB capacitor array to adjust the terminal potential value of each of the (n-m) bits of the MSB capacitor array.

10. A method according to claim 9, wherein the step (c) further comprises steps of:

(c1) providing at least one capacitor and at least one switch corresponding to each bit of the LSB capacitor array and receiving a second and a third reference voltage values via the LSB capacitor array, wherein the second reference voltage value is one half of the first reference voltage value and the third reference voltage value is the first reference voltage value multiplying 1/$(2)^m$;

(c2) maintaining the terminal potential value of each of the (n-m) bits of the MSB capacitor array unchanged when the terminal potential value of each of the m bits of the LSB capacitor array is adjusted; and (c3) switching the at least one switch of each of the m bits of the LSB capacitor array to adjust the terminal potential value of each of the m bits of the LSB capacitor array.

* * * * *

UNITED STATES PATENT AND TRADEMARK OFFICE
CERTIFICATE OF CORRECTION

| | | |
|---|---|---|
| PATENT NO. | : 8,004,447 B2 | Page 1 of 1 |
| APPLICATION NO. | : 12/693713 | |
| DATED | : August 23, 2011 | |
| INVENTOR(S) | : Pochin Hsu | |

It is certified that error appears in the above-identified patent and that said Letters Patent is hereby corrected as shown below:

ON THE TITLE PAGE

At item (73), delete "Holtek Semiconductor" and insert therefor --Holtek Semiconductor Inc.--.

Signed and Sealed this
Thirty-first Day of January, 2012

David J. Kappos
*Director of the United States Patent and Trademark Office*